(12) United States Patent
Chae et al.

(10) Patent No.: US 11,140,346 B2
(45) Date of Patent: Oct. 5, 2021

(54) ANALOG-TO-DIGITAL CONVERTER AND IMAGE SENSOR HAVING THE SAME

(71) Applicants: Samsung Electronics Co., Ltd., Suwon-si (KR); Industry-Academic Cooperation Foundation, Yonsei University, Seoul (KR)

(72) Inventors: Youngcheol Chae, Seoul (KR); Sang-hyun Cho, Hwaseong-si (KR); Min-ho Kwon, Seoul (KR); Seung-hyun Lim, Hwaseong-si (KR); Woo-jin Jo, Seoul (KR)

(73) Assignees: Samsung Electronics Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 127 days.

(21) Appl. No.: 15/718,598

(22) Filed: Sep. 28, 2017

(65) Prior Publication Data

US 2018/0109747 A1    Apr. 19, 2018

(30) Foreign Application Priority Data

Oct. 19, 2016    (KR) .................. 10-2016-0135924

(51) Int. Cl.
*H04N 5/378*    (2011.01)
*H03M 1/16*    (2006.01)
(Continued)

(52) U.S. Cl.
CPC ............ *H04N 5/378* (2013.01); *H03M 1/124* (2013.01); *H03M 1/162* (2013.01); *H03M 1/361* (2013.01);
(Continued)

(58) Field of Classification Search
CPC ........ H04N 5/378; H03M 1/38; H03M 1/825; H03M 3/39
(Continued)

(56) References Cited

U.S. PATENT DOCUMENTS

| 6,538,588 B1 | 3/2003 | Bazarjani |
| 7,907,079 B1 | 3/2011 | Galloway et al. |

(Continued)

FOREIGN PATENT DOCUMENTS

| JP | 2014-090308 A | 5/2014 |
| JP | 2015-023391 A | 2/2015 |

(Continued)

OTHER PUBLICATIONS

Chae, Youngcheol, et al. Solid-State Circuits, IEEE Journal of, 2011, 46.1: 236-24.

(Continued)

*Primary Examiner* — Anthony J Daniels
(74) *Attorney, Agent, or Firm* — Harness, Dickey & Pierce, P.L.C.

(57) ABSTRACT

An analog-to-digital converter configured to convert an analog signal into a digital signal includes a first converter configured to receive an input signal of an analog type, compare the input signal with a plurality of reference signals, select one of the plurality of reference signals based on the comparison, and output an upper bit that is a portion of the digital signal based on the selected reference signal, a second converter configured to perform an oversampling operation n times based on a residue signal indicating a difference between an upper analog signal corresponding to the upper bit value and the input signal and output an intermediate bit value of the digital signal corresponding to the first to n-th oversampling signals generated respectively during the oversampling operations performed n times, and
(Continued)

a third converter configured to output a lower bit value of the digital signal corresponding to the n-th oversampling signal.

14 Claims, 11 Drawing Sheets

(51) Int. Cl.
    *H03M 1/12*     (2006.01)
    *H03M 1/36*     (2006.01)
    *H03M 1/38*     (2006.01)
    *H03M 3/00*     (2006.01)
    *H04N 5/3745*     (2011.01)
    *H03M 1/56*     (2006.01)

(52) U.S. Cl.
    CPC ............. *H03M 1/38* (2013.01); *H03M 3/494* (2013.01); *H04N 5/37455* (2013.01); *H03M 1/56* (2013.01); *H03M 3/46* (2013.01)

(58) Field of Classification Search
    USPC ......................................................... 348/294
    See application file for complete search history.

(56) References Cited

U.S. PATENT DOCUMENTS

| | | | |
|---|---|---|---|
| 7,916,061 B2 | 3/2011 | Chae et al. | |
| 9,344,627 B2 | 5/2016 | Yoo et al. | |
| 9,660,662 B2 * | 5/2017 | Venca | H03M 1/804 |
| 9,900,023 B1 * | 2/2018 | Kinyua | H03M 3/46 |
| 2008/0258959 A1 * | 10/2008 | Trifonov | H03M 1/145 341/156 |
| 2013/0027231 A1 * | 1/2013 | Meacham | H03M 1/0673 341/110 |
| 2014/0232890 A1 * | 8/2014 | Yoo | H04N 5/23245 348/220.1 |
| 2015/0138005 A1 * | 5/2015 | Shiraishi | H03M 3/414 341/122 |
| 2015/0138007 A1 * | 5/2015 | Shiraishi | H03M 1/1245 341/156 |
| 2016/0065231 A1 * | 3/2016 | Gonen | H03M 1/14 341/156 |
| 2016/0141327 A1 | 5/2016 | Verdant | |
| 2017/0077940 A1 * | 3/2017 | Yoshioka | H03M 1/1245 |

FOREIGN PATENT DOCUMENTS

| | | |
|---|---|---|
| JP | 2015-211391 A | 11/2015 |
| KR | 10-0204539 B1 | 6/1999 |

OTHER PUBLICATIONS

Seo, Min-Woong, et al. Electron Devices, IEEE Transactions on, 2012, 59.12: 3396-3400.

* cited by examiner

ANALOG-TO-DIGITAL CONVERTER AND IMAGE SENSOR HAVING THE SAME

CROSS-REFERENCE TO RELATED APPLICATION

This application claims the benefit of Korean Patent Application No. 10-2016-0135924, filed on Oct. 19, 2016, in the Korean Intellectual Property Office, the disclosure of which is incorporated herein in its entirety by reference.

BACKGROUND

The inventive concepts relates to an analog-to-digital converter (ADC) and an image sensor having the same, and for example, to a high-resolution ADC capable of high-speed operations and an image sensor having the same.

An image sensor can capture an image based on the properties of semiconductors responsive to light. For example, a complementary metal-oxide semiconductor (CMOS) image sensor may have less power consumption than a charge-coupled device (CCD) image sensor and has been used for portable phones or digital cameras according to the development of CMOS technology.

A CMOS image sensor may include an analog-to-digital converter (ADC) configured to convert an image signal sensed as an analog signal into a digital signal. A pixel array of the CMOS image sensor may receive light and output an image signal. Each pixel of the pixel array may accumulate photocharge corresponding to the quantity of light incident to a photodiode (PD), and output an analog-type pixel signal according to the accumulated photocharges. The analog pixel signal may be then converted into a digital signal by the ADC.

SUMMARY

The inventive concepts provide a high-resolution analog-to-digital converter (ADC) that has a high dynamic range and is capable of a high-speed operation.

The inventive concepts also provide a high-resolution image sensor that has a high dynamic range and is capable of a high-speed operation.

According to an example embodiment of the inventive concepts, there is provided an ADC configured to convert an analog signal into a digital signal. The ADC includes a first converter configured to operate in a first mode to receive a first input signal of an analog type, compare the first input signal with a plurality of reference signals, select one out of the plurality of reference signals based on the comparison, and output an upper bit value that is at least a portion of the digital signal based on the selected reference signal, a second converter configured to operate in a second mode to perform an oversampling operation n times based on a residue signal, where n is an integer, the residue signal indicating a difference between an upper analog signal corresponding to the upper bit value and the first input signal, and output an intermediate bit value of the digital signal corresponding to first to n-th oversampling signals generated respectively, during the oversampling operations performed n times, and a third converter configured to operate in a third mode to output a lower bit value of the digital signal corresponding to the n-th oversampling signal.

According to another example embodiment of the inventive concepts, there is provided an image sensor including a pixel array including a plurality of pixels connected to column lines, respectively, the plurality of pixels being configured to respectively sense incident light and generate an analog signal through the column lines, and an ADC connected to at least one of, the column lines and configured to convert the analog signal into a digital signal. The ADC includes an upper bit converter configured to receive a first input signal from among the analog signals, compare a plurality of reference signals with the first input signal by successive approximation, select one out of the plurality of reference signals, and output at least one upper bit value that is at least a portion of the digital signal based on the selected reference signal, and a lower bit converter configured to perform an oversampling operation n times based on a residue signal, where n is an integer, the residue signal being a difference value between an upper analog signal corresponding to the at least one upper bit value and the first input signal, and the lower bit converter configured to output at least one lower bit value of the digital signal corresponding to the residue signal.

According to another example embodiment of the inventive concepts, there is provided an electronic device comprising a converter configured to operate in a successive approximation mode to generate at least one of a plurality of upper bit values of an input signal and to generate an analog signal corresponding to the upper bit values, and configured to operate in a delta-sigma mode to generate at least one of a plurality of lower bit values of the input signal by performing an oversampling operation n times, where n is an integer, and to amplify a difference between the input signal and the analog signal.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
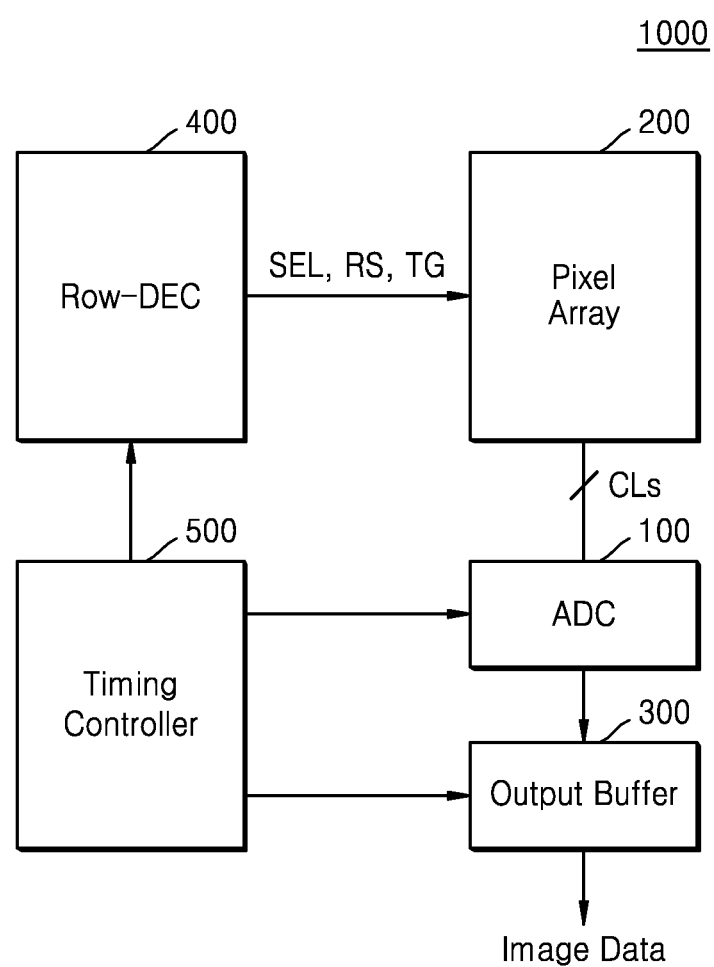
FIG. 1 is a block diagram of an image sensor according to an example embodiment.

Embodiments will now be described in detail with reference to the accompanying drawings, in which some embodi- FIG. 1 is a block diagram of an image sensor 1000 according to an example embodiment.

Referring to FIG. 1, the image sensor 1000 may include an analog-to-digital converter (ADC) 100, a pixel array 200, an output buffer 300, a row decoder 400, and a timing controller 500.

The pixel array 200 may include a plurality of pixels. Each of, or at least one of, the pixels may convert an optical signal into an electric signal. The pixel array 200 may be driven in response to driving signals, such as a selection signal SEL, a reset signal RS, and a transmission signal TG. The row decoder 400 may output such a signal. A plurality of column lines CLs may provide a pixel signal, which is an electric signal sensed by each of, or at least one of, the pixels in response to the driving signals, to the ADC 100 through a plurality of column lines CLs. The ADC 100 according to an example embodiment will be described below with reference to FIG. 2.

The output buffer 300 may latch and output respective columns of image data provided by the ADC 100. The output buffer 300 may temporarily store image data output by the ADC 100 under control of the timing controller 500 and then output image data sequentially latched by a column decoder.

The row decoder 400 may select any one row of the pixel array 200 under the control of the timing controller 500. The row decoder 400 may generate a selection signal SEL to select any one out of a plurality of rows. Also, the row decoder 400 may sequentially enable a reset signal RS and a transmission signal TG in a selected row of pixels. Thus, an analog-type pixel signal may be generated and output by each of, or at least one of, the pixels in a selected row. The ADC 100 may convert a pixel signal, which is transmitted through the plurality of column lines CLs, into a digital signal.

The timing controller 500 may control the row decoder 400, the ADC 100, and the output buffer 300. For example, the timing controller 500 may generate a control signal for controlling general processes for outputting image data obtained by sensing an image, based on time information.

Figure 2:
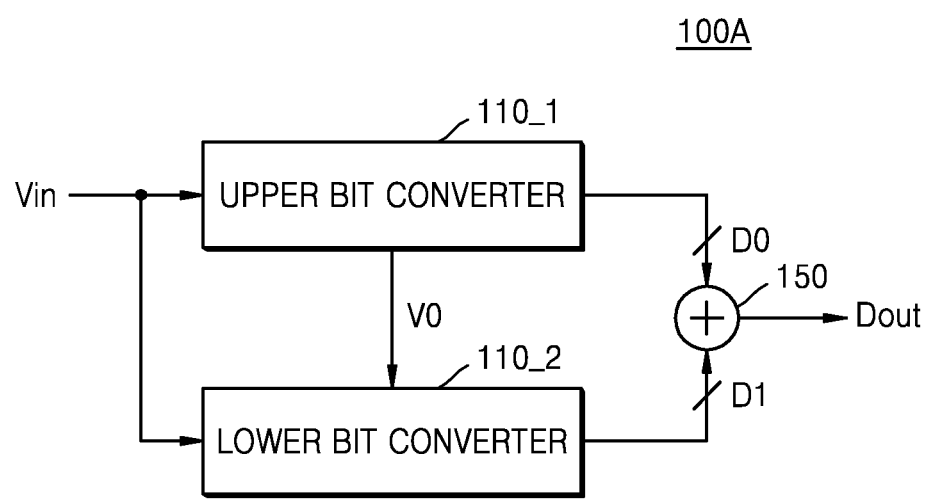
FIG. 2 is a block diagram of an analog-to-digital converter (ADC) shown in FIG. 1, according to an example embodiment.

FIG. 2 is a block diagram of the ADC 100 shown in FIG. 1, according to an example embodiment.

Referring to FIG. 2, an ADC 100A according to the example embodiment may include an upper bit converter 110_1, a lower bit converter 110_2, and an adder 150. The plurality of column lines CLs of FIG. 1 may transmit an analog-type input signal Vin. The ADC 100A may convert the analog-type input signal Vin into a digital signal Dout. The input signal Vin may be a pixel signal output by the pixel array 200 of FIG. 1.

The upper bit converter 110_1 may convert an analog-type input signal Vin, which is transmitted through the plurality of column lines CLs of FIG. 1. The upper bit converter 110_1 may digitally convert the input signal Vin, generate an upper bit value D0 that is at least a portion of the digital signal Dout, and output the upper bit value D0 to the adder 150. The upper bit value D0 may include a most significant bit (MSB) of the digital signal Dout.

The upper bit converter 110_1 may output a temporary upper analog signal V0 corresponding to the upper bit value D0 to the lower bit converter 110_2. Alternatively, the upper bit converter 110_1 may output the upper bit value D0 to the lower bit converter 110_2. Accordingly, the upper bit converter 110_1 may include a digital-to-analog converter (DAC). For instance, the upper bit converter 110_1 may be a successive-approximation-register analog-to-digital converter (SAR-ADC). Alternatively, the upper bit converter 110_1 may be a flash ADC. However, the inventive concepts are not limited thereto.

The lower bit converter 110_2 may receive the input signal Vin and the upper analog signal V0. However, the inventive concepts are not limited thereto and the lower bit converter 110_2 may directly receive a residue signal, which is a signal indicating a difference between the input signal Vin and the upper analog signal V0. Alternatively, the lower bit converter 110_2 may receive the upper bit value D0 and perform a DAC operation. The lower bit converter 110_2 may generate a lower bit value D1 of the digital signal Dout based on the input signal Vin and the upper analog signal V0 or based on the residue signal, and output the lower bit value D1 to the adder 150. For example, the lower bit converter 110_2 may include a delta-sigma ADC. However, the inventive concepts are not limited thereto.

The adder 150 may receive the upper bit value D0 and the lower bit value D1 from the upper bit converter 110_1 and the lower bit converter 110_2, respectively. The adder may synthesize the upper bit value D0 and the lower bit value D1. The adder may output a digital signal Dout corresponding to the input signal Vin. Accordingly, the ADC 100A may be configured such that respectively different converters generate an upper bit value and a lower bit value of a digital signal Dout. After the upper bit converter 110_1 narrows a range of the input signal Vin through an ADC operation, the lower bit converter 110_1 may operate based on the narrowed range. Thus, since an ADC conversion operation includes at least two operations, higher-resolution image data may be obtained.

Figure 3:
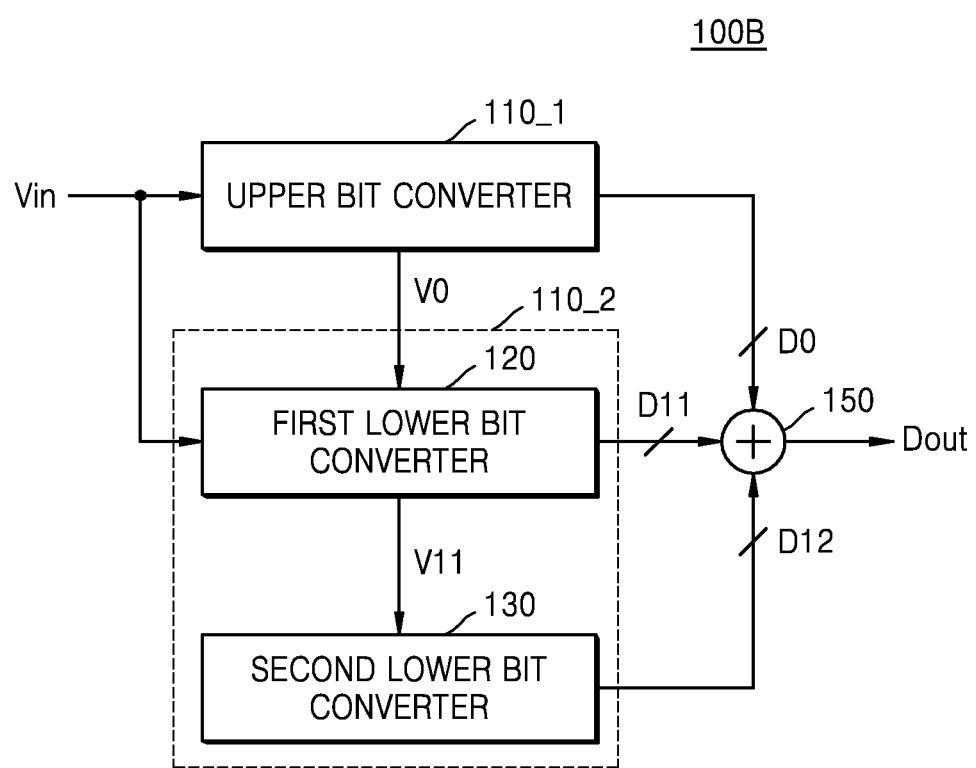
FIG. 3 is a block diagram of the ADC shown in FIG. 1, according to an example embodiment.

FIG. 3 is a block diagram of the ADC 100 shown in FIG. 1, according to an example embodiment. In FIG. 3, the same reference numerals denote the same elements as in FIG. 2. Detailed descriptions of the same elements as in FIG. 2 will be omitted for brevity.

Referring to FIG. 3, an ADC 100B according to the example embodiment may include an upper bit converter 110_1, a lower bit converter 110_2m and an adder 150. The lower bit converter 110_2 may include a first lower bit converter 120 and a second lower bit converter 130.

The ADC 100B may convert the analog-type input signal Vin, which is transmitted through the plurality of column lines CLs of FIG. 1, into a digital signal Dout. The input signal Vin may be a pixel signal output by the pixel array 200 of FIG. 1.

The first lower bit converter 120 may receive an input signal Vin and an upper analog signal V0 corresponding to an upper bit value D0. The upper analog signal V0 may be obtained by converting the upper bit value D0 into an analog signal by using a DAC. However, the inventive concepts are not limited thereto, and the first lower bit converter 120 may directly receive a residue signal, which is a signal indicating a difference between the input signal Vin and the upper analog signal V0. Alternatively or additionally, the first lower bit converter 120 may receive the upper bit value D0 and perform a DAC operation.

The first lower bit converter 120 may perform an oversampling operation n times based on the residue signal, which is the signal indicating the difference between the input signal Vin and the upper analog signal V0. The first lower bit converter 120 may generate a first lower bit value D11 of the digital signal Dout corresponding to each of, or at least one of, the first to n-th oversampling signals generated during the oversampling operations performed n times.

The first lower bit converter 120 may output the first lower bit value D11 to the adder 150. The first lower bit converter 120 may output a lower analog signal V11 to the second lower bit converter 130. The lower analog signal V11 may be an n-th oversampling signal. For example, the first lower bit converter 120 may include a delta-sigma ADC.

The second lower bit converter 130 may receive the lower analog signal V11 and output a second lower bit value D12 of the digital signal Dout. In this case, the second lower bit value D12 may include a least significant bit (LSB) of the digital signal Dout. The second lower bit converter 130 may output the second lower bit value D12 to the adder 150. For example, the second lower bit converter 130 may include a single-slope ADC.

The input signal Vin may include a first input signal and a second input signal, and the second input signal may be applied to the ADC 100B after the first input signal. The first input signal and the second input signal may be respectively converted into a first digital signal and a second digital signal by the ADC 100B.

While the second lower bit converter 130 is outputting a second lower bit value of the first digital signal, the upper bit converter 110_1 and the first lower bit converter 120 may receive the second input signal and respectively output an upper bit value and a first lower bit value of the second digital signal.

The adder 150 may receive the upper bit value D0, the first lower bit value D11, and the second lower bit value D12 from the upper bit converter 110_1, the first lower bit converter 120, and the second lower bit converter 130, respectively. The adder may synthesize the upper bit value D0, the first lower bit value D11, and the second lower bit value D12. The adder may output the digital signal Dout corresponding to the input signal Vin.

Accordingly, the ADC 100B may be configured such that respectively different converters generate an upper bit value, a first lower bit value, and a second Lower bit value. After the upper bit converter 110_1 primarily narrows a range of the input signal Vin through an ADC operation, the first lower bit converter 120 and the second lower bit converter 130 may operate. Thus, since a conversion operation includes three operations, higher-resolution image data may be obtained. Operations of each of the upper bit converter 110_1, the first lower bit converter 120, and the second lower bit converter 130 will be described in detail below.

Figure 4:
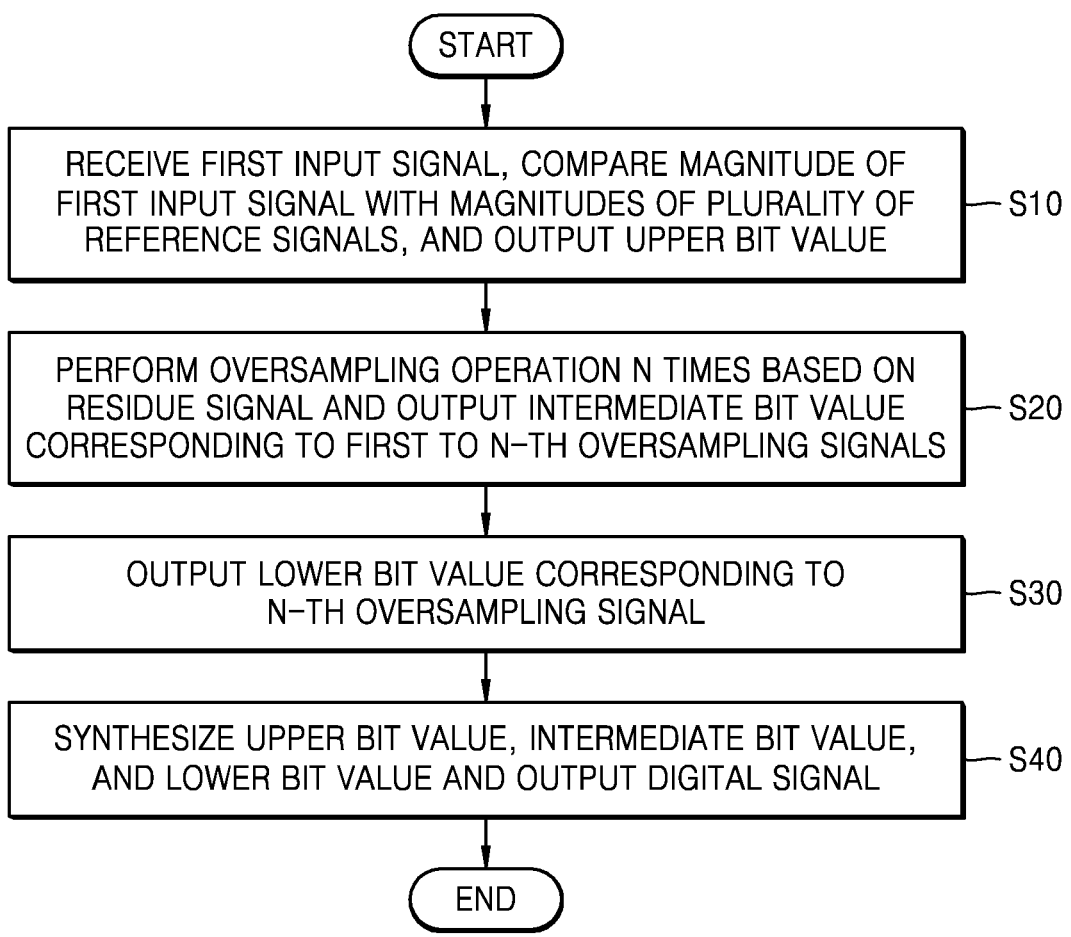
FIG. 4 is a flowchart of operations of an ADC according to an example embodiment.
Figure 5:
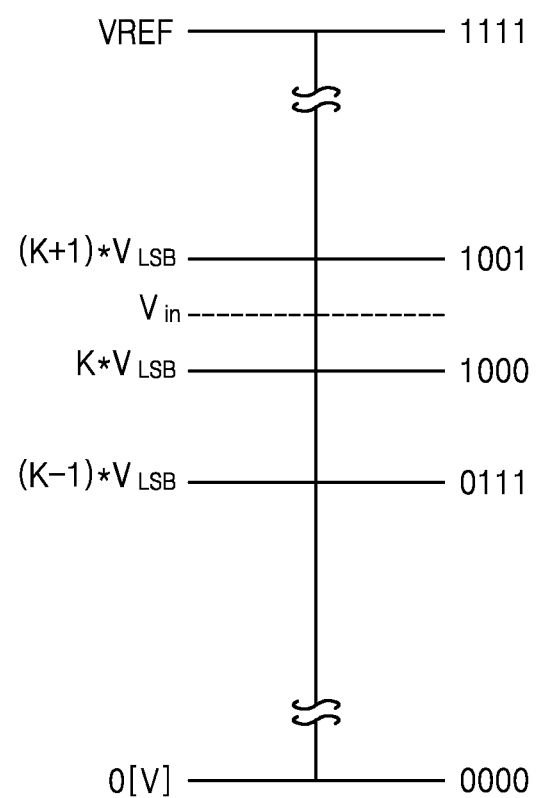
FIG. 5 is a diagram of an upper bit converter of FIGS. 2 and 3, according to an example embodiment.

FIG. 4 is a flowchart of operations of an ADC according to an example embodiment. FIG. 5 is a diagram of the upper bit converters shown in FIGS. 2 and 3, according to an example embodiment. Detailed descriptions of the same elements as in FIGS. 2 and 3 will be omitted for brevity.

Referring to FIGS. 3, 4, and 5, in a first mode, the upper bit converter 110_1 may receive an analog-type input signal Vin, and compare the input signal Vin with a plurality of reference analog signals. The plurality of reference analog signals may be 0 [V], ..., $(k-1)*V_{LSB}$, $k*V_{LSB}$, $(k+1)*V_{LSB}$, ..., and VREF [V]. k may be a natural number equal to or more than 2, and $V_{LSB}$ may indicate a voltage difference between respective bits.

In this case, VREF [V] may indicate a maximum value of the analog-type input signal $V_{in}$, which is transmitted through the plurality of column lines CLs of FIG. 1. Also, 0[V] may indicate a minimum value of the input signal Vin. Accordingly, respective values of the plurality of reference analog signals are not limited to the above-described examples and may vary according to a range of the pixel signal output by the pixel array 200 of FIG. 1.

The upper bit converter 110_1 may compare the input signal Vin with the plurality of reference analog signals and select one of the plurality of reference analog signals. For example, the minimum reference analog signal $(k+1)*V_{LSB}$ may be selected out of the reference analog signals having values greater than a magnitude of the input signal Vin. Alternatively, the maximum reference analog signal $k*V_{LSB}$ may be selected out of the reference analog signals having values less than the magnitude of the input signal Vin. However, the inventive concepts are not limited thereto. For example, a reference analog signal having a value closest to the magnitude of the input signal Vin may be selected.

Each of, or at least one of, the reference analog signals may have a reference digital signal corresponding thereto. For example, when a 4-bit reference digital signal is generated as shown in FIG. 5, the plurality of reference analog signals 0 [V], ..., $(k-1)*V_{LSB}$, $k*V_{LSB}$, $(k+1)*V_{LSB}$, ..., and VREF [V] may correspond to reference digital signals 0000, ..., 0111, 1000, 1001, ..., and 1111, respectively. Accordingly, the upper bit converter 110_1 may output a reference digital signal corresponding to one selected reference analog signal as an upper bit value D0 of at least a portion of the digital signal Dout (S10).

For example, when the upper bit converter 110_1 includes a flash ADC, the upper bit converter 110_1 may compare the input signal Vin with all of the plurality of reference analog signals concurrently. The upper bit converter 110_1 may select one out of the plurality of reference analog signals. The upper bit converter 110_1 may output a reference digital signal corresponding to the selected reference analog signal as an upper bit value D0 of at least a portion of the digital signal Dout.

A case in which the upper bit converter 110_1 includes an SAR ADC will be described in detail below with reference to FIG. 6A.

Referring back to FIGS. 3 and 4, in a second mode, the first lower bit converter 120 may receive an input signal Vin and an upper analog signal V0 corresponding to the upper bit value D0. The first lower bit converter 120 may generate a residue signal, which is a difference between the input signal Vin and the upper analog signal V0. However, the inventive concepts are not limited thereto, and the first lower bit converter 110_2 may directly receive the residue signal from the outside.

The first lower bit converter 120 may perform an oversampling operation n times based on the residue signal. While performing the oversampling operation n times, the first lower bit converter 120 may respectively generate each of first to n-th oversampling signals, and output a first lower bit value D11 of the digital signal Dout corresponding to the first to n-th oversampling signals (S20). Accordingly, the first lower bit converter 120 may include an integrator.

In a third mode, the second lower bit converter 130 may receive the n-th oversampling signal from the first lower bit converter 120, and output a second lower bit value of the digital signal Dout corresponding to the n-th oversampling signal (S30). The lower analog signal V11 may be the n-th oversampling signal. For example, as compared with the second mode, in the third mode, the second lower bit converter 130 may perform additional divided ADC operations on the n-th oversampling signal. Thus, in the third mode, the second lower bit converter 130 may perform subdivided ADC operations on the input signal Vin.

The adder 150 may receive the upper bit value D0, the first lower bit value D11, and the second lower bit value D12 from the upper bit converter 110_1, the first lower bit converter 120, and the second lower bit converter 130, respectively. The adder 150 may synthesize the upper bit value D0, the first lower bit value D11, and the second lower bit value D12. The adder 150 may output a digital signal Dout corresponding to the input signal Vin (S40).

In comparison with the ADC according to the example embodiment, a programmable gain amplifier may amplify all pixel signals by a common gain. Thus, when light having a high intensity is irradiated to some pixels, the light may exceed a range in which the ADC may perform a conversion operation. Accordingly, when the programmable gain amplifier is used, there may be a limit in precisely representing the intensity of light incident to each of, or at least one of, the pixels.

In contrast, the ADC according to the example embodiment may primarily restrict a range of the input signal Vin to the upper bit value D0 in the first mode, and generate a residue signal, which corresponds to a difference between the input signal Vin and the upper analog signal V0 corresponding to the upper bit value D0. While an oversampling operation is being performed n times in the second mode, about the same effects may be obtained as in a case in which only the residue signal is amplified. Thus, the input signal Vin may not exceed a range in which the ADC may perform an ADC operation. For example, a dynamic range may increase.

The first-mode operation, the second-mode operation, and the third-mode operation may be sequentially performed. The third-mode operation on the first input signal may be performed concurrently with the first-mode and second-mode operations on the second input signal. Thus, the ADC according to the example embodiment may be capable of a high-speed operation.

Figure 6A:
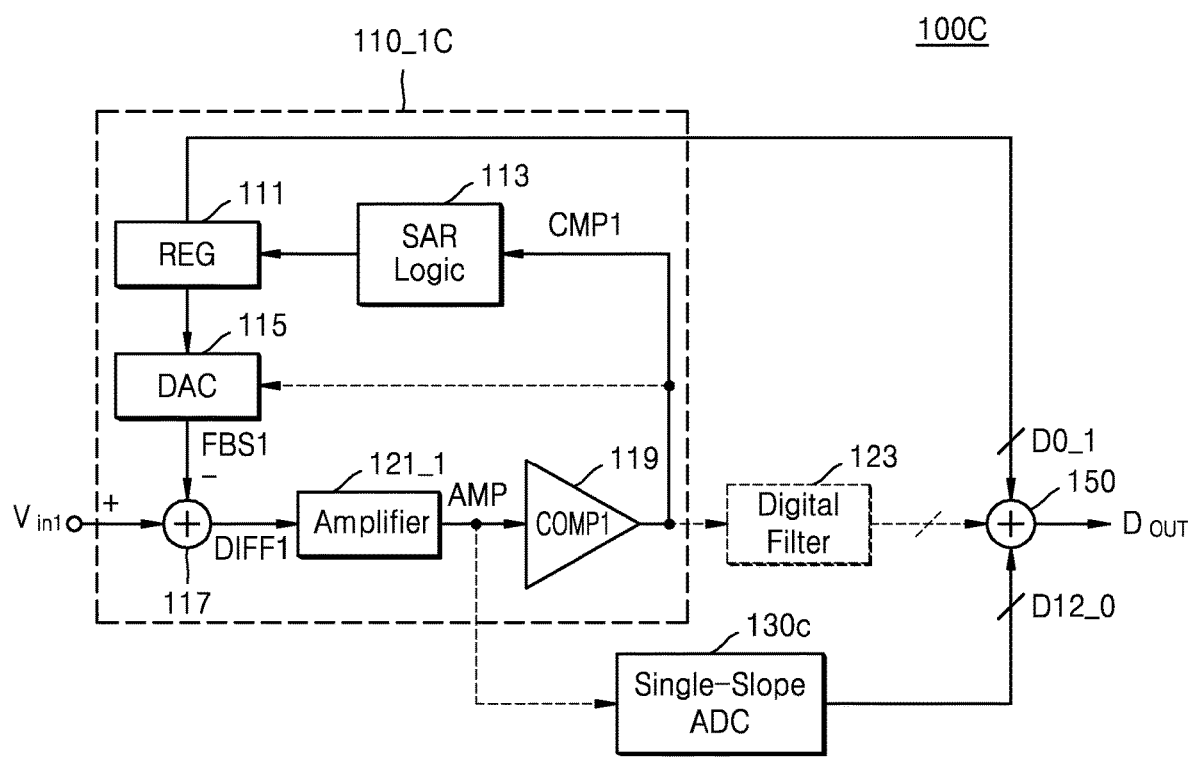
FIG. 6A is a block diagram of an ADC according to an example embodiment, which illustrates an operation S10 of FIG. 4.
Figure 6B:
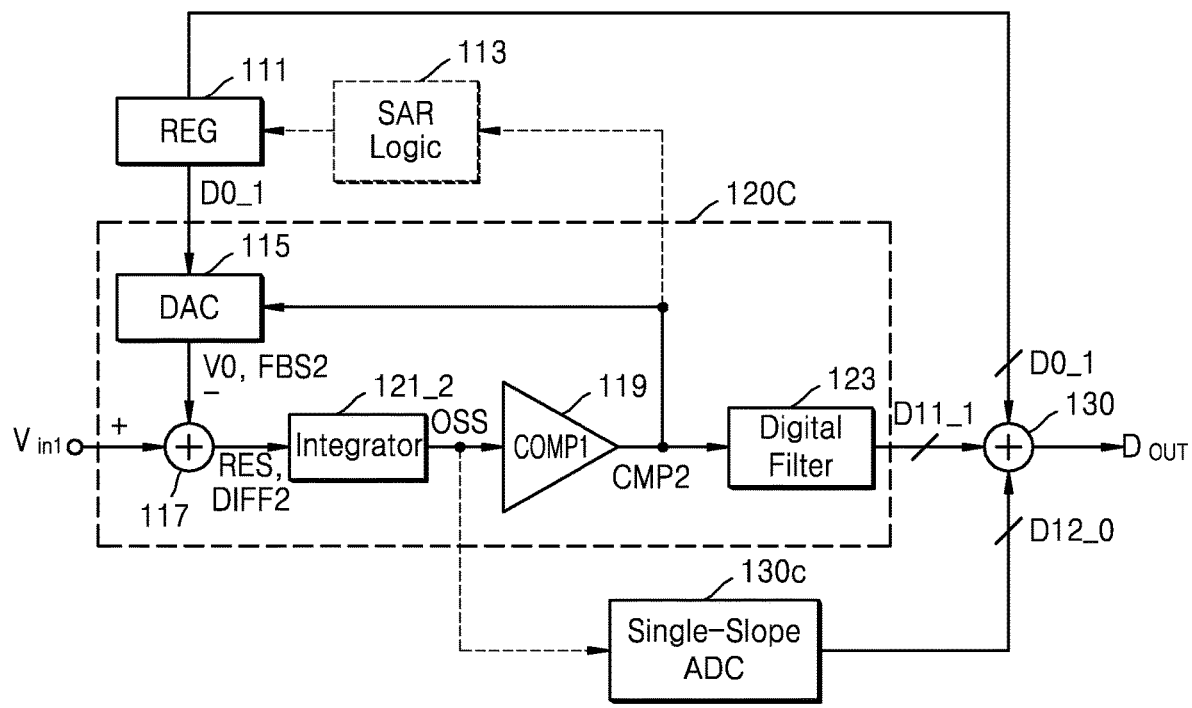
FIG. 6B is a block diagram of an ADC according to an example embodiment, which illustrates an operation S20 of FIG. 4.
Figure 6C:
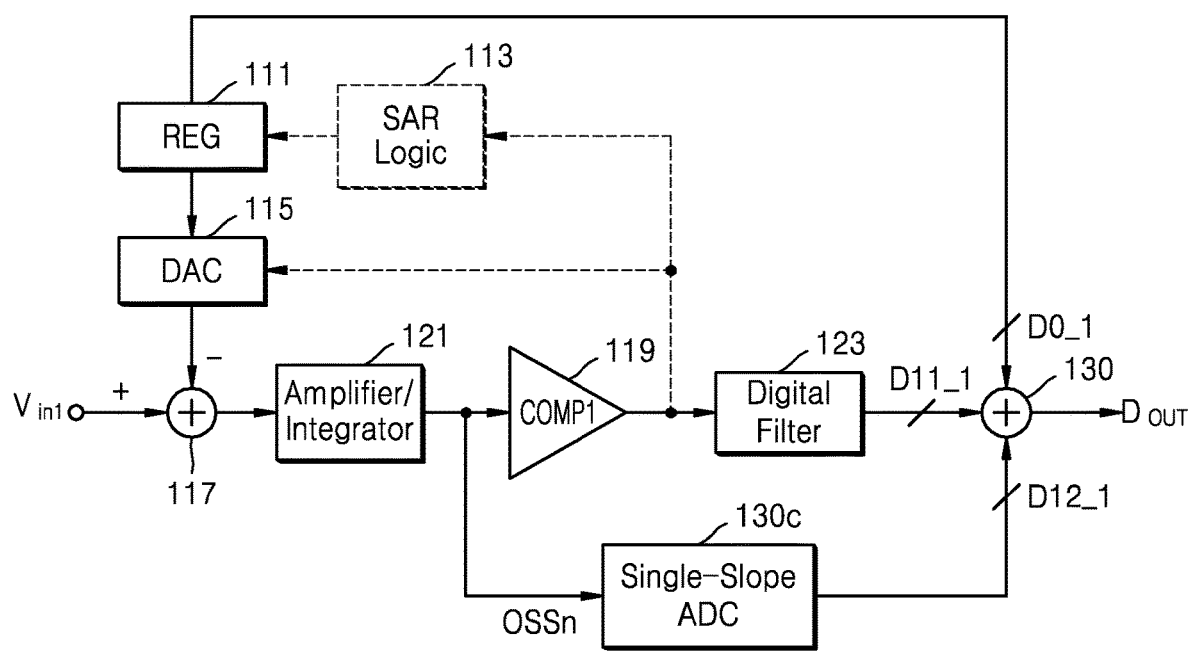
FIG. 6C is a block diagram of an ADC according to an example embodiment, which illustrates operations S30 and S40 of FIG. 4.
Figure 7:
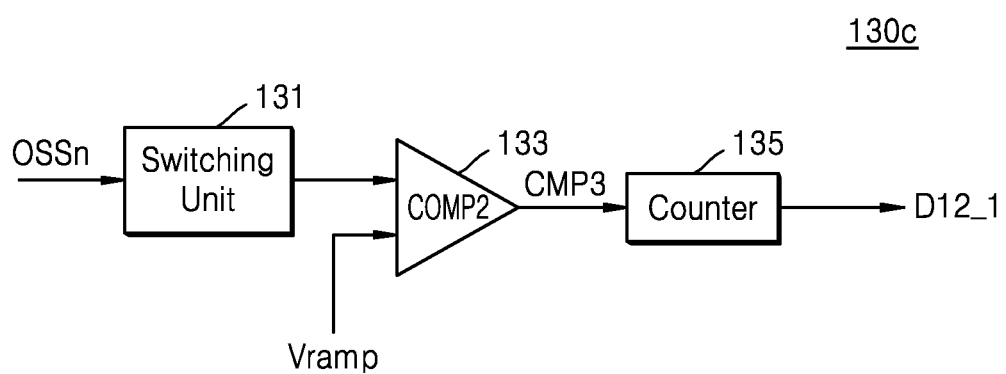
FIG. 7 is a block diagram of a single-slope ADC of FIGS. 6A to 6C, according to an example embodiment.

FIGS. 6A to 6C are block diagrams of an ADC according to an example embodiment. FIG. 6A is a detailed diagram of operation S10 of FIG. 4, FIG. 6B is a detailed diagram of operation S20 of FIG. 4, and FIG. 6C is a detailed diagram of operations S30 and S40 of FIG. 4. In the ADC 100C, an enabled region is illustrated with a solid line, and a disabled region is illustrated with a dashed line. In FIGS. 6A to 6C, the same reference numerals are used to denote the same elements. FIG. 7 is a block diagram of a single-slope ADC of FIGS. 6A to 6C, according to an example embodiment.

Referring to FIG. 6A, an ADC 100C according to an example embodiment may include a register 111, a SAR logic block, 113, a DAC 115, a subtracter 117, a first comparator 119, an amplifier 121_1, a digital filter 123, and a single-slope ADC 130c. In this case, the register 111, the SAR logic block 113, the DAC 115, the subtracter 117, the first comparator 119, and the amplifier 121_1 may constitute an upper bit converter 110_1c. FIG. 6A illustrates a case in which an SAR ADC is used as the upper bit converter 110_1c, but the inventive concepts are not limited thereto.

In a first mode, the subtracter 117 may receive a first input signal Vin1 of an analog type and a first feedback signal FBS1 output by the DAC 115. The subtracter 117 may subtract the first feedback signal FBS1 from the first input signal Vin1 and generate a first difference signal DIFF1.

The amplifier 121_1 may serve to receive the first difference signal DIFF1, simply amplify the first difference signal DIFF1, and output an amplification signal AMP to the first comparator 119.

The first comparator 119 may compare a magnitude of the amplification signal AMP with a magnitude of a first comparison signal and output a first comparison result signal CMP1. For example, the first comparison signal may be connected to a ground and indicate a value of 0[V]. For example, the first comparator 119 may output a first comparison result signal CMP1 having a logic high level when the amplification signal AMP has a magnitude greater than or equal to the magnitude of the first comparison signal, and output a first comparison result signal CMP1 having a logic low level when the amplification signal AMP has a magnitude less than the magnitude of the first comparison signal. Accordingly, the first comparison result signal CMP1 may correspond to a 1-bit digital signal.

An SAR ADC operation may be a conversion operation using a binary search algorithm. The SAR logic block 113 may generate a plurality of reference digital signals for a binary search algorithm. The SAR logic block 113 may receive the first comparison result signal CMP1 and output a second reference digital signal, which is different from the first reference digital signal that is the previous reference digital signal, depending on whether a logic level of the first comparison result signal CMP1 is a high level or a low level. For example, when the logic level of the first comparison result signal CMP1 is the high level, the SAR logic block 113 may output a second reference digital signal having a higher magnitude than the first reference digital signal. Alternatively, when the logic level of the first comparison result signal CMP1 is the low level, the SAR logic block 113 may output a second reference digital signal having a lower magnitude than the first reference digital signal.

The plurality of reference analog signals may be 0 [V], $(k-1)*V_{LSB}$, $k*V_{LSB}$, $(k+1)*V_{LSB}$, and VREF [V] of FIG. 5, and the plurality of reference digital signals may be 0000, 0111, 1000, 1001, and 1111 of FIG. 5. VREF [V] may indicate a maximum value of the first input signal Vin1, and 0 [V] may indicate a minimum value of the first input signal Vin1. Accordingly, respective values of the plurality of reference analog signals are not limited to the above-described examples and may vary according to a range of the pixel signal output by the pixel array 200 of FIG. 1.

The register 111 may store a reference digital signal output by the SAR logic block 113. The register 111 may output the stored reference digital signal to the DAC 115. The DAC 115 may convert the reference digital signal into a reference analog signal and output a first feedback signal FBS1 to the subtracter 117.

The register 111 may output the stored reference digital signal as an upper bit value D0_1 that is at least a portion of a first digital signal. The register 111 may output the upper bit value D0_1 to the adder 150.

The single-slope ADC 130c may constitute the second lower bit converter 130 of FIG. 3. In a first mode, the single-slope ADC 130c may perform a conversion operation on an input signal applied to the ADC 100C prior to the first input signal Vin1 and output a second lower bit value D12_0 of a digital signal into which the input signal is converted, to the adder 150.

Referring to FIG. 6B, the DAC 115, the subtracter 117, the first comparator 119, an integrator 121_2, and the digital filter 123 may constitute a first lower bit converter 120c. FIG. 6B illustrates a case in which a delta-sigma ADC is used as the first lower bit converter 120c. Although the delta-sigma ADC shown in FIG. 6B is a primary delta-sigma ADC, the inventive concepts are not limited thereto.

When a second mode begins, the DAC 115 may receive an upper bit value D0_1 that is at least a portion of the first digital signal from the register 111. The DAC 115 may perform a DAC operation on the upper bit value D0_1. The DAC 115 may generate the upper analog signal V0. When the second mode begins, the subtracter 117 may receive a first input signal Vin1 of an analog type and an upper analog signal V0 output by the DAC 115. The subtracter 117 may subtract the upper analog signal V0 from the first input signal Vin1 and generate a residue signal RES.

The integrator 121_2 may integrate the residue signal RES and generate a first oversampling signal. Also, the integrator 121_2 may perform an oversampling operation n times based on the residue signal RES and generate first to n-th oversampling signals OSS. Operations of the integrator 121_2 will be described in detail below. For example, the integrator 121_2 may be a loop filter. The integrator 121_2 may have substantially the same configuration as the amplifier 121_1 of FIG. 6A. The integrator 121_2 may be configured to operate as the amplifier 121_1 or the integrator 121_2 depending on whether an operation mode is a first mode or a second mode. However, the inventive concepts are not limited thereto, and the amplifier 121_1 of FIG. 6A and the integrator 121_2 of FIG. 6B may be separately formed in the ADC 100C.

The first comparator 119 may compare magnitudes of the first to n-th oversampling signals OSS with a magnitude of a second comparison signal, respectively, and output a second comparison result signal CMP2. For example, the first comparator 119 may output a second comparison result signal CMP2 having a logic high level when the first to n-th oversampling signals OSS have magnitudes greater than or equal to the magnitude of the second comparison signal, and output a second comparison result signal CMP2 having a logic low level when the first to n-th oversampling signals OSS have magnitudes less than the magnitude of the second comparison signal. Accordingly, the second comparison result signal CMP2 may correspond to a 1-bit digital signal.

The DAC 115 may receive the second comparison result signal CMP2, receive the upper bit value D0_1 from the register 111, and convert the second comparison result signal CMP2 and the upper bit value D0_1 into a second feedback signal FBS2 that is an analog signal. Accordingly, as the number of oversampling operations in the second mode increases, the DAC 115 may generate a new second feedback signal FBS2 again and output the new second feedback signal FBS2 to the subtracter 117.

The subtracter 117 may subtract the second feedback signal FBS2 from the first input signal Vin1 and generate a second difference signal DIFF2. Accordingly, in the second mode, as the number of oversampling operations increases, the new second feedback signal FBS2 may be applied to the subtracter 117 so that the subtracter 117 may generate a new second difference signal DIFF2. The integrator 121_2 may integrate the new second difference signal DIFF2 to increase the number of oversampling operations, and generate second to n-th oversampling signals.

The digital filter 123 may generate a first lower bit value D11_1 of the first digital signal based on the second comparison result signal CMP2. For example, the digital filter 123 may include a counter. The digital filter 123 may add up second comparison result signals CMP2 generated during a first time duration for which a timing signal applied to the digital filter 123 has a first logic level, generate some bits of the first lower bit value D11_1, and generate second comparison result signals CMP2 generated during the second time duration for which the timing signal has a second logic level, as other some bits of the first lower bit value D11_1 to generate the first Lower bit value D11_1.

Accordingly, in the second mode, the first lower bit converter 120c may perform an oversampling operation n times based on a residue signal RES, which is a difference value between an upper analog signal V0 corresponding to the upper bit value D0_1 and the first input signal Vin. The digital filter 123 may output a first lower bit value D11_1 corresponding to each of the first to n-th oversampling signals OSS generated respectively, during the oversampling operations performed n times.

Referring to FIGS. 6C and 7, the single-slope ADC 130c may constitute the second lower bit converter 130 of FIG. 3. However, the inventive concepts are not limited thereto.

The single-slope ADC 130c may include a switching unit 131, a second comparator 133, and a counter 135.

The switching unit 131 may control an n-th oversampling signal OSSn applied to the second comparator 133, based on a switch signal SW. The n-th oversampling signal OSSn may be a signal output by the integrator 121_2 of the first lower bit converter 120c after the first lower bit converter 120c of FIG. 6B performs the oversampling operation n times in the second mode.

In the first and second modes, the switching unit 131 may be turned off so that the n-th oversampling signal OSSn may not be transmitted to the second comparator 133. When a third mode begins, the switching unit 131 may be turned on so that the n-th oversampling signal OSSn may be transmitted to the second comparator 133.

The second comparator 133 may receive the n-th oversampling signal OSSn and a ramp signal Vramp, compare a magnitude of the n-th oversampling signal OSSn with a magnitude of the ramp signal Vramp, and output a third comparison result signal CMP3. For example, the second comparator 133 may output a third comparison result signal CMP3 having a logic high level when the n-th oversampling signal OSSn has a magnitude less than a magnitude of the ramp signal Vramp, and output a third comparison result signal CMP3 having a logic low level when the n-th oversampling signal OSSn has a magnitude greater than or equal to the magnitude of the ramp signal Vramp.

The counter 135 may generate a digital signal based on the third comparison result signal CMP3 and a count clock signal. The digital signal may be a second lower bit value D12_1 of the first digital signal. The counter 135 may output the second lower bit value D12_1 to the adder 150.

When the third mode ends, the adder 150 may receive the upper bit value D0_1, the first lower bit value D11_1, and the second lower bit value D12_1 from the upper bit converter 110_1c of FIG. 6A and the first lower bit converter 120 and the second lower bit converter 130 of FIG. 6B, synthesize the upper bit value D0_1, the first lower bit value D11_1, and the second lower bit value D12_1, and output a first digital signal. In this case, the second lower bit value D12_1 may include an LSB value of the first digital signal.

Referring back to FIGS. 6C and 7, in a portion of the third mode, when the second comparator 133 finishes receiving the n-th oversampling signal OSSn, the switching unit 131 may be turned off so that an amplifier/integrator 121 may not be electrically connected to the single-slope ADC 130c. Even if the switching unit 131 is turned off, the single-slope ADC 130c may perform an ADC operation.

Figure 8:
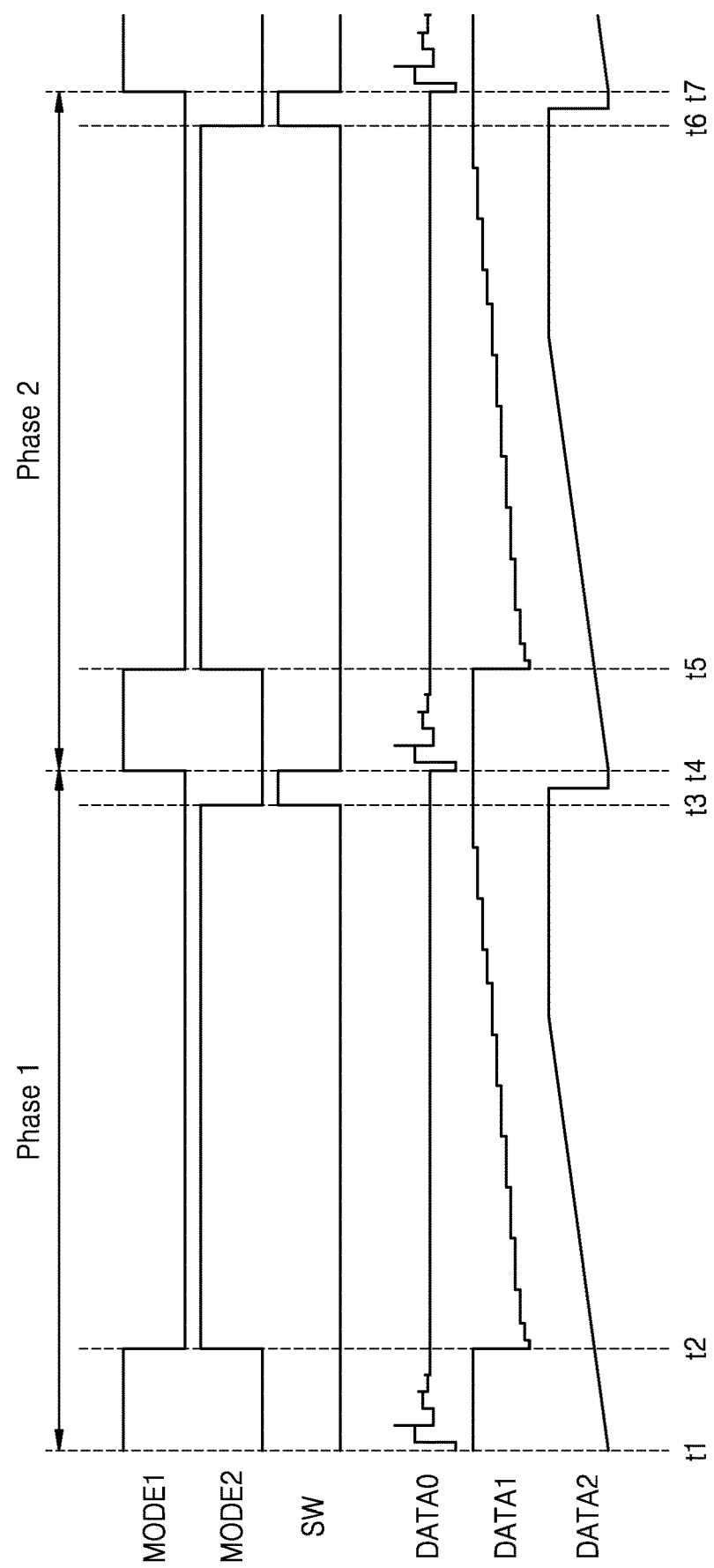
FIG. 8 is a conceptual timing diagram of an operation of an ADC according to an example embodiment.

FIG. 8 is a conceptual timing diagram of an operation of an ADC according to an example embodiment. Specifically, FIG. 8 illustrates an operation of the ADC 100C shown in FIGS. 6A to 6C.

Referring to FIG. 8, a first phase Phase 1 denotes a phase in which a first input signal Vin1 is applied to an ADC according to an example embodiment, and a second phase Phase 2 denotes a phase in which a second input signal is applied to the ADC. The first phase Phase 1 may progress from a first time point t1 to a fourth time point t4, and the second phase Phase 2 may progress from the fourth time point t4 to a seventh time point t7. The ADC may perform an ADC operation on the first input signal Vin1 and the second input signal and output a first digital signal and a second digital signal, respectively.

Referring to FIGS. 6A and 8, when a logic level of a first mode signal MODE1 reaches a high level, a first mode may be enabled. Accordingly, in the first phase Phase 1, the first mode may be enabled from the first time point t1 in which the logic level of the first mode signal MODE1 reaches the high level to a second time point t2 in which the logic level of the first mode signal MODE1 reaches a low level. When the first mode is enabled, the upper bit converter 110_1c may operate and generate an upper bit value D0_1 of a first digital signal corresponding to the first input signal Vin1 applied to the ADC 100C. Upper bit data DATA0 may be a digital value represented by a decimal number during a process of finding the upper bit value D0_1. Accordingly, after the first mode ends, the upper bit value D0_1 of the first digital signal Dout1 may be obtained by representing a value of the upper bit data DATA0 by a binary number.

In the second phase Phase 2, when the logic level of the first mode signal MODE1 rises to a high level to enable the first mode, the upper bit converter 110_1c may operate from the fourth time point t4 to a fifth time point t5. The upper bit converter 110_1 may generate an upper bit value of a second digital signal Dout2 corresponding to the second input signal applied to the ADC 100C. After the first mode, the upper bit value of the second digital signal Dout2 may be obtained by representing a value of the upper bit data DATA0 by a binary number.

However, the inventive concepts are not limited thereto. For example, the first mode may be enabled when the logic level of the first mode signal MODE1 is dropped to a low level.

Referring to FIGS. 6B and 8, when a logic level of a second mode signal MODE2 reaches a high level, a second mode may be enabled. Accordingly, in the first phase Phase 1, the second mode may be enabled from the second time point t2 to a third time point t3. When the second mode is enabled, the first lower bit converter 120c may operate and perform an ADC operation on the first input signal Vin1 applied to the ADC 100C, and generate a first lower bit value D11_1 of the first digital signal. First lower bit data DATA1 may be a digital value represented by a decimal number during a process of finding the first lower bit value D11_1. Accordingly, after the second mode ends, the first lower bit value D11_1 of the first digital signal Dout1 may be obtained by representing a value of the first lower bit data DATA1 by a binary number.

In the second phase Phase 2, when the logic level of the second mode signal MODE2 rises to a high level to enable the second mode, the first lower bit converter 120c may operate from the fifth time point t5 to a sixth time point t6. The first lower bit converter 120c may perform an ADC operation on the second input signal applied to ADC 100C and generate a first lower bit value of the second digital signal. After the first mode ends, a first lower bit value of the second digital signal may be obtained by representing a value of the first lower bit data DATA1 by a binary number.

In addition, the inventive concepts are not limited to a case in which a time point in which the logic level of the first mode signal MODE1 reaches the low level and a time point in which the logic level of the second mode signal MODE2 reaches the high level are the same as the second time point t2 and the fifth time point t5, respectively. There may be a time interval between a time point in which the logic level of the first mode signal MODE1 reaches the low level and the time point in which the logic level of the second mode signal MODE2 reaches the high level.

Referring to FIGS. 6C, 7, and 8, when a logic level of a switch signal SW reaches a high level, the switching unit 131 may be turned on. Accordingly, in the first phase Phase 1, the switching unit 131 may be turned on from the third time point t3 to the fourth time point t4. An n-th oversampling signal OSSn may be applied to the second comparator 133.

After the fourth time point t4, the logic level of the switch signal SW may be dropped to a low level so that the switching unit 131 may be turned off. Thus, in the second phase Phase 2, data related to the second input signal may not be applied to the single-slope ADC 130c. In the second phase Phase 2, the single-slope ADC 130c may perform an ADC operation on the first input signal Vin1.

First-mode, second-mode, and third-mode operations on the first input signal Vin1 and the second input signal may be sequentially performed.

The third-mode operation on the first input signal Vin1 may be performed concurrently with first-mode and second-mode operations on the second input signal. For example, a phase in which the single-slope DAC 130c performs an operation on the first input signal Vin1 may overlap a phase in which the upper bit converter 110_1c and the first lower bit converter 120c perform a conversion operation on the second input signal. Accordingly, it may be possible to perform a pipeline operation of performing ADC operations on the first input signal Vin1 and the second input signal concurrently. The operations may be performed in parallel. Thus, the ADC 100C according to the example embodiment may enable a high-speed conversion operation.

The inventive concepts are not limited to a case in which a time point in which the logic level of the second mode signal MODE2 reaches the low level and a time point in which the logic level of the switch signal SW reaches the high level are the same as the third time point t3 and the sixth time point t6, respectively. There may be a time interval between the time point in which the logic level of the second mode signal MODE2 reaches the low level and the time point in which the logic level of the switch signal SW reaches the high level.

In addition, the inventive concepts are not limited to a case in which a time point in which the logic level of the switch signal SW reaches the low level and a time point in which the logic level of the first mode signal MODE1 reaches the high level are the same as the fourth time point t4 and the seventh time point t7, respectively. There may be a time interval between the time point in which the logic level of the switch signal SW reaches the low level and the time point in which the logic level of the first mode signal MODE1 reaches the high level.

Figure 9:
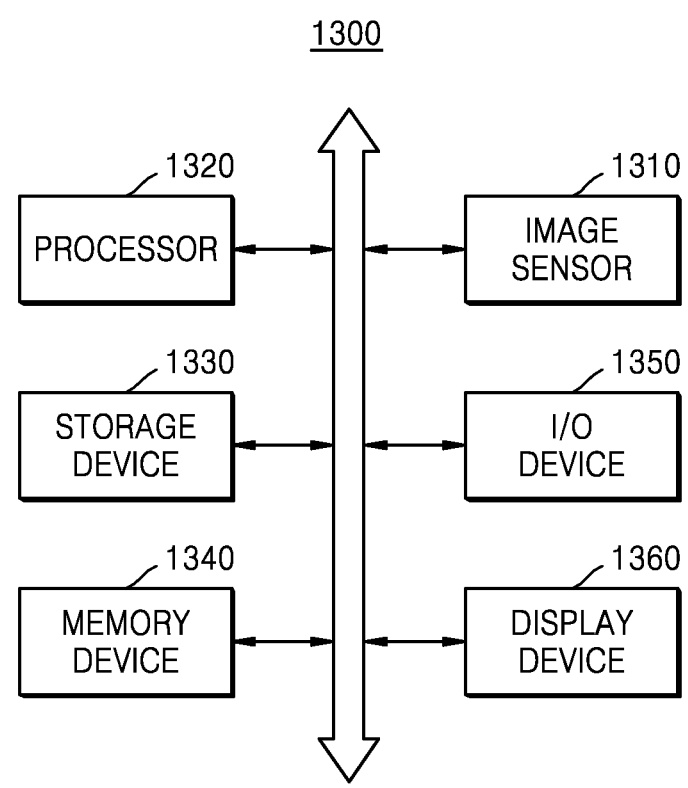
FIG. 9 is a block diagram of a computing system including an image sensor according to an example embodiment.

FIG. 9 is a block diagram of a computing system 1300 including an image sensor 1310 according to an example embodiment.

Referring to FIG. 9, the computing system 1300 may include an image sensor 1310, a processor 1320, a storage device 1330, a memory device 1340, an I/O device 1350, and a display device 1360. Although not shown in FIG. 9, the computing system 1300 may further include ports capable of communicating with a video card, a sound card, a memory card, and a universal serial bus (USB) device or communicating with other electronic devices.

The image sensor 1310 may generate image data corresponding to incident light. The display device 1360 may display image data. The storage device 1330 may store the image data. The processor 1320 may control operations of the image sensor 1310, the display device 1360, and the storage device 1330.

The processor 1320 may perform specific calculations or tasks. In an example embodiment, the processor 1320 may be connected to the storage device 1330, the memory device 1340, and the I/O device 1350 via an address bus, a control bus, and a data bus and perform communication operations. In an example embodiment, the processor 1320 may also be connected to an expansion bus, such as a peripheral component interconnect (PCI) bus.

The storage device 1330 may include at least one of a flash memory device, a solid-state drive (SSD), a hard disk drive (HDD), a compact disc-read only memory (CD-ROM), and non-volatile memory devices having various shapes.

The memory device 1340 may store data required for an operation of the computing system 1300. For example, the memory device 1340 may include a volatile memory, such as dynamic random access memory (DRAM) and static RAM (SRAM), and a non-volatile memory device, such as erasable programmable read-only memory (EPROM), electrically erasable programmable ROM (EEPROM), and flash memory device.

The I/O device 1350 may include an input unit, such as a keyboard, a keypad, or a mouse, and an output unit, such as a printer and a display.

The image sensor 1310 may be embodied by the image sensor 1000 shown in FIG. 1. The image sensor 1000 of FIG. 1 may include the ADC 100*a* shown in FIG. 2, the ADC 100*b* shown in FIG. 3, or the ADC 100C shown in FIGS. 6A to 6C.

The image sensor 1310 may be embodied by packages having various shapes. For example, at least some elements of the image sensor 1310 may be mounted by using packages, such as Package on Packages (PoPs), ball grid arrays (BGAs), chip-scale packages (CSPs), plastic-leaded chip carriers (PLCCs), plastic dual in-line packages (PDIPs), die-in-waffle-packs, die-in-wafer-forms, chip-on-boards (COBs), ceramic dual in-line packages (CERDIPs), plastic metric quad flat-packs (MQFPs), thin quad flat-packs (TQFPs), small outlines (SOICs), shrink small outline packages (SSOPs), thin small outlines (TSOPs), thin quad flat-packs (TQFPs), system-in-packages (SIPs), multi-chip packages (MCPs), wafer-level fabricated packages (WFPs), or wafer-level processed stack packages (WSPs).

In an example embodiment, the image sensor 1310 may be integrated with the processor 1320 in a single chip. In another embodiment, the image sensor 1310 and the processor 1320 may be integrated in respectively different chips.

The computing system 1300 may be interpreted as being one of various computing systems including the image sensor 1310. For example, the computing system 1300 may include a digital camera, a mobile device, a personal digital assistant (PDA), a portable multimedia player (PMP), or a smartphone.

While the inventive concepts have been particularly shown and described with reference to embodiments thereof, it will be understood that various changes in form and details may be made therein without departing from the spirit and scope of the following claims.

What is claimed is:

1. An analog-to-digital converter configured to convert an analog signal into a digital signal, the analog-to-digital converter comprising:
   a first converter configured to operate in a first mode to receive a first input signal of an analog type, compare the first input signal with a plurality of reference signals, select one out of the plurality of reference signals based on the comparison, and output at least one upper bit value that is at least a portion of the digital signal based on the selected reference signal;
   a second converter configured to operate in a second mode to perform an oversampling operation n times based on a residue signal, where n is an integer, the residue signal indicating a difference between an upper analog signal corresponding to the at least one upper bit value and the first input signal, and output an intermediate bit value of the digital signal corresponding to first to n-th oversampling signals generated respectively during the oversampling operations performed n times; and
   a third converter configured to operate in a third mode to output at least one lower bit value of the digital signal corresponding to the n-th oversampling signal,
   wherein the analog-to-digital converter is configured to operate on the first input signal in the first mode, the second mode, and the third mode sequentially,
   wherein the analog-to-digital converter is further configured to receive a second input signal of an analog type after the first input signal, and to convert the second input signal into a second digital signal,
   wherein the third converter is configured to operate in the third mode on the first input signal contemporaneously with the first converter operating on the second input signal in the first mode and the second converter operating on the second input signal in the second mode.

2. The analog-to-digital converter of claim 1, wherein the first converter is configured to perform a successive approximation operation to compare a magnitude of the first input signal with magnitudes of reference signals and output the at least one upper bit value based on the comparison.

3. The analog-to-digital converter of claim 2, wherein the first converter includes a register configured to store the at least one upper bit value, the at least one upper bit value being obtained by performing the successive approximation operation, and the first converter is configured to transmit the at least one upper bit value to the second converter when the second converter operates in the second mode.

4. The analog-to-digital converter of claim 1, wherein the first converter includes a flash analog-to-digital converter.

5. The analog-to-digital converter of claim 1, further comprising
   an adder configured to synthesize the upper bit value, the intermediate bit value, and the lower bit value, and to generate the digital signal.

6. The analog-to-digital converter of claim 1, wherein the third converter is configured to operate in the third mode on the first input signal after the first mode and second mode operations on the first input signal end.

7. An image sensor comprising:
   a pixel array including a plurality of pixels connected to column lines, the plurality of pixels being configured to respectively sense incident light and generate analog signals through the column lines; and
   an analog-to-digital converter connected to at least one of the column lines and configured to convert the analog signals into digital signals,
   wherein the analog-to-digital converter includes,
   an upper bit converter configured to receive a first input signal from among the analog signals, compare a plurality of reference signals with the first input signal by successive approximation, select one out of the plurality of reference signals, and output at least one upper bit value that is at least a portion of the digital signal based on the selected reference signal, and a lower bit converter configured to perform an oversampling operation n times based on a residue signal, where n is an integer, the residue signal being a difference value between an upper analog signal corresponding to the at least one upper bit value and the first input signal, the lower bit converter configured to output at least one lower bit value of the digital signal corresponding to the residue signal, wherein the lower bit converter comprises:

a first lower bit converter configured to perform an oversampling operation n times based on the residue signal, the residue signal being the difference value between the upper analog signal and the first input signal, and output a first lower bit value corresponding to first to n-th oversampling signals generated respectively, during the oversampling operations performed n times; and a second lower bit converter configured to output a second lower bit value corresponding to the n-th oversampling signal, wherein, while the second lower bit converter is configured to perform an operation on the first input signal, at least one of the upper bit converter and the first lower bit converter is configured to perform a conversion operation on a second input signal from among the analog signals received after the first input signal.

8. The image sensor of claim 7, wherein the lower bit converter comprises a delta-sigma analog-to-digital converter.

9. The image sensor of claim 7, wherein the second lower bit converter is configured to receive the n-th oversampling signal and start operating after operations of the upper bit converter and the first lower bit converter on the first input signal end.

10. The image sensor of claim 7, wherein the second lower bit converter comprises a switching unit configured to control input of the n-th oversampling signal, wherein the switching unit is turned on while the upper bit converter and the first lower bit converter are performing a conversion operation on the second input signal.

11. The image sensor of claim 7, wherein the second lower bit converter comprises a single-slope analog-to-digital converter.

12. An electronic device comprising:

a converter configured to, operate in a successive approximation mode to generate at least one of a plurality of upper bit values of an input signal, generate an upper analog signal by converting the plurality of upper bit values, generate a residue signal by subtracting the upper analog signal from the input signal, amplify the residue signal, and operate in a delta-sigma mode to generate at least one of a plurality of lower bit values of the input signal by performing an oversampling operation n times, where n is an integer, wherein the converter is configured to operate in a single-slope mode to output a least significant bit corresponding to an nth oversampling signal, the nth oversampling signal generated after the oversampling operation n times in the delta-sigma mode, wherein the input signal includes a first input signal and a second input signal, wherein the converter is configured to receive the second input signal after the first input signal, and operate in the successive approximation mode on the second input signal contemporaneously with operating in the single-slope mode on the first input signal.

13. The electronic device of claim 12, wherein the converter includes:

an adder configured to receive at least one of the plurality of upper bit values, at least one of the plurality of lower bit values, and the least significant bit, to synthesize a digital signal corresponding to a sum of the plurality of upper bit values, the plurality of lower bit values, and the least significant bit, and to output the digital signal.

14. The electronic device of claim 12, wherein the input signal is an analog input signal corresponding to an intensity of light incident on a pixel array.

* * * * *